United States Patent [19]

Frait

[11] 4,016,457
[45] Apr. 5, 1977

[54] FAILSAFE SYSTEM FOR SKID CONTROL SYSTEMS AND THE LIKE

[75] Inventor: John S. Frait, Ann Arbor, Mich.

[73] Assignee: Kelsey-Hayes Company, Romulus, Mich.

[22] Filed: Apr. 10, 1975

[21] Appl. No.: 566,767

Related U.S. Application Data

[62] Division of Ser. No. 408,104, Oct. 19, 1973, Pat. No. 3,891,279.

[52] U.S. Cl. .................................. 361/49; 324/51; 361/88
[51] Int. Cl.² ......................................... H02H 3/24
[58] Field of Search ............... 317/18 B, 18 C, 31, 317/33 VR; 340/253 B, 256; 324/51

[56] References Cited

UNITED STATES PATENTS

| | | | |
|---|---|---|---|
| 3,133,275 | 5/1964 | Cohrt et al. | 340/253 B |
| 3,201,606 | 8/1965 | Mamon | 317/31 X |
| 3,405,319 | 10/1968 | Barringer | 317/33 VR X |
| 3,426,217 | 2/1969 | Womble, Jr. | 340/256 X |
| 3,679,965 | 7/1972 | Wilkinson | 317/31 X |
| 3,753,078 | 8/1973 | Hedel | 317/33 VR X |
| 3,765,008 | 10/1973 | Lowry | 340/256 X |
| 3,825,307 | 7/1974 | Carr et al. | 324/51 X |
| 3,846,793 | 11/1974 | Cook | 340/256 X |

Primary Examiner—J D Miller
Assistant Examiner—Patrick R. Salce
Attorney, Agent, or Firm—Harness, Dickey & Pierce

[57] ABSTRACT

A failsafe system for a skid control system for a multi-axle wheeled vehicle. The skid control system has a plurality of skid control modules, each of which is operatively associated with one of the axles of the vehicle and the skid control modules are operatively coupled by wiring on the vehicle. Each skid control module comprises a skid control circuit for skid controlling the wheels of the associated axle, which circuit is supplied from an electrical power source such as the vehicle battery, either regulated or unregulated. A failsafe circuit is provided in each skid control module and the failsafe circuits of the several modules are connected in cascade fashion to form a chain. An input signal is supplied to the input of the first of the cascaded failsafe circuits and can propagate through the chain of failsafe circuits to the output of the last failsafe circuit only if wiring connecting the modules is proper, the failsafe circuits themselves are operating properly, and electrical power is supplied to each module. A warning occurs when the signal fails to propagate through all the failsafe circuits, and this indicates loss of power or a fault in the modules or the wiring connecting the modules.

6 Claims, 4 Drawing Figures

U.S. Patent
April 5, 1977
4,016,457
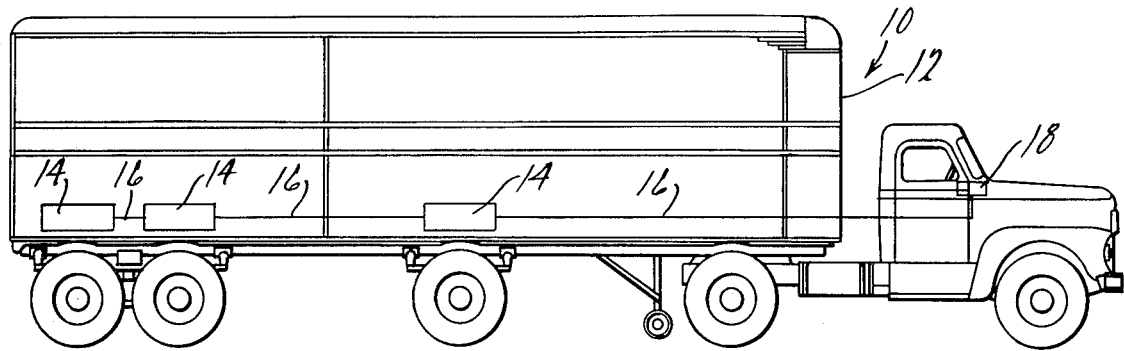
FIG. 1.
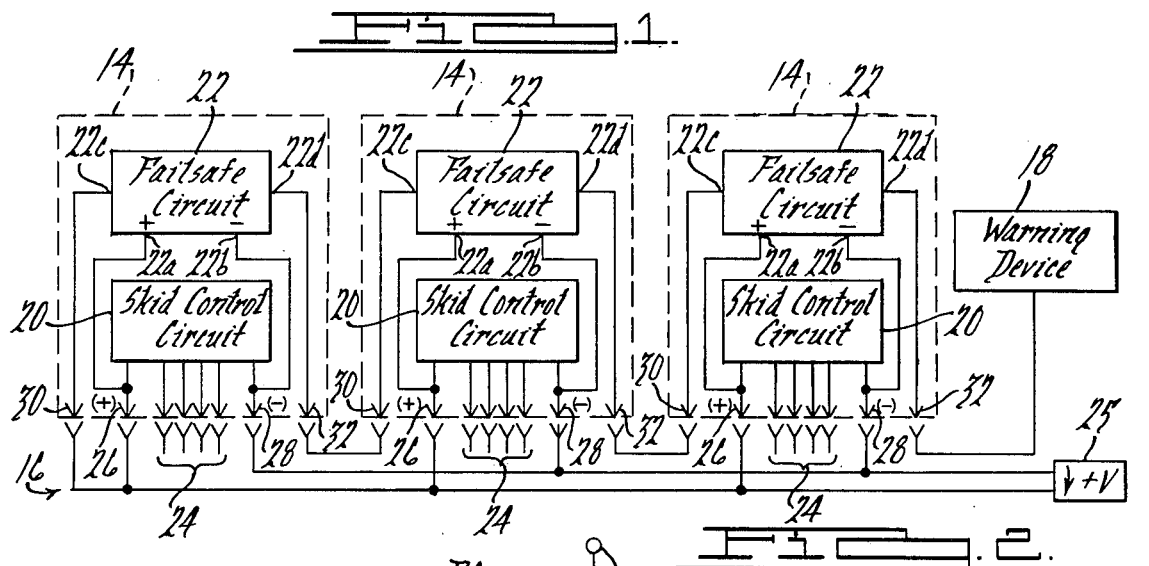
FIG. 2.
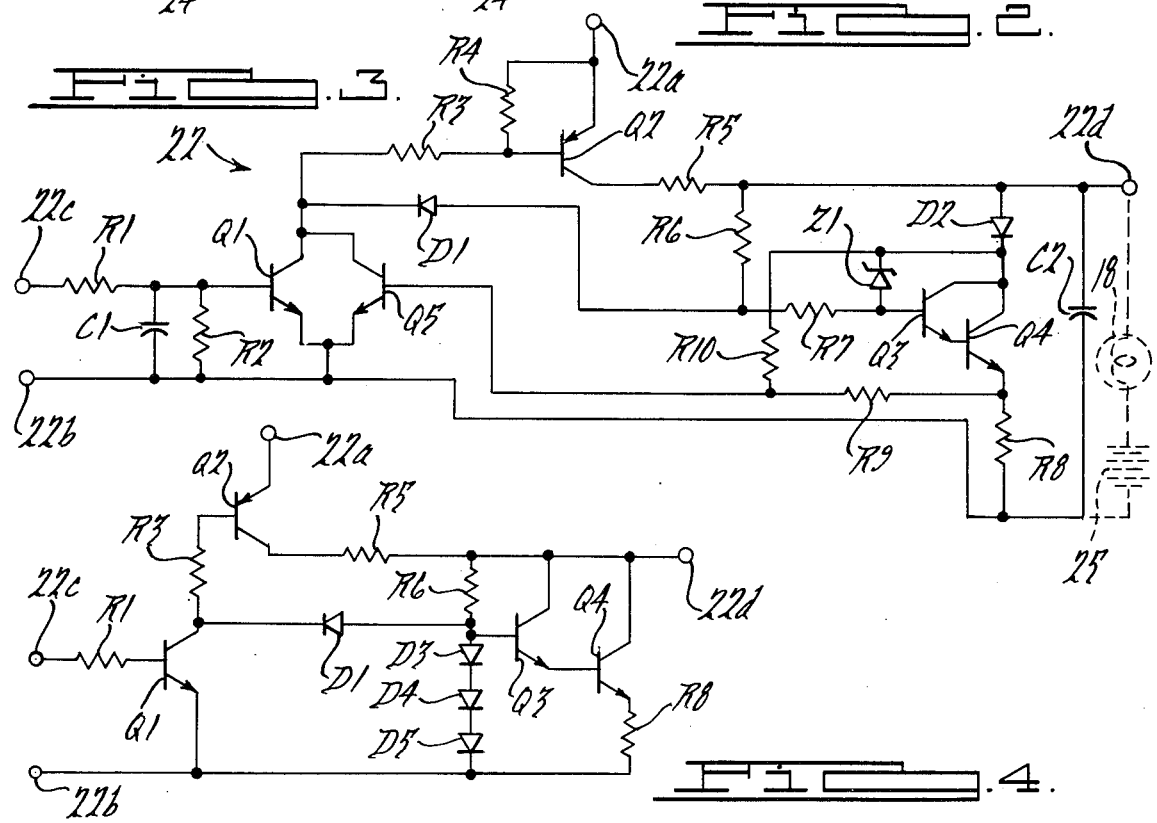
FIG. 3.
FIG. 4.

FAILSAFE SYSTEM FOR SKID CONTROL SYSTEMS AND THE LIKE

This is a division of application Ser. No. 408,104, filed Oct. 19, 1973, now U.S. Pat. No. 3,891,279.

BACKGROUND AND SUMMARY OF THE INVENTION

The present invention relates to a failsafe system which is especially useful in skid control systems and the like.

In vehicle skid control systems it is especially important that defects in the wiring connecting components of the system be made known since such defects can potentially render the skid control system unknowingly inoperative. Heretofore failsafe circuits have been included in skid control systems for monitoring open wires, failure of wheel speed sensors, etc. In mass-produced vehicles produced by assembly-line techniques it is typical to have prefabricated wiring harnesses which can be quickly installed on the vehicle and easily connected to the electrical components via suitable plugs. Such wiring harnesses can be checked before installation on the vehicle to insure proper circuit continuity between terminals of the plugs which mate which complementary plugs on electrical components. However, in certain specialized or custom types of vehicles, such as custom-built trailers for example, pre-fabricated harnesses are usually not used for reasons of cost and therefore, wiring is typically performed on a custom basis with individual wires being routed on the vehicle between the various components. With this assembly procedure, proper continuity and connection of the wiring cannot usually be conveniently and economically determined.

The present invention is directed to a failsafe system which provides a warning signal to indicate a fault in the skid control system indicative of either improperly connected or faulty wiring, failure of one or more of the failsafe circuits, or loss of electrical power in the system. The invention is especially advantageous in custom-built multi-axle vehicles having skid control for each axle, although it will be appreciated that the invention is useful in other applications. One feature of the invention provides a failsafe circuit for each skid control module which is operatively associated with each individual axle. A more specific feature of the invention involves the connection of these failsafe circuits in cascading fashion with the failsafe circuits being arranged and constructed to propagate a signal through the cascaded chain of failsafe circuits so long as electrical power is being supplied in correct polarity to each of the skid control modules. If power is lost at any module, a warning signal is given. The invention also provides a warning signal in the event of a wiring fault due to improper connections at assembly or due to a subsequent wiring fault in a properly connected wiring. Furthermore, the invention exhibits a self-checking feature wherein a failure of any of the individual failsafe circuits also provides a warning signal.

The foregoing features of the invention along with additional advantages and benefits thereof will be seen in the ensuing description and claims which are to be taken in conjunction with the accompanying drawing.

BRIEF DESCRIPTION OF THE DRAWING

The drawing illustrates preferred embodiments of the invention in accordance with the best mode presently contemplated for carrying out the invention.

FIG. 1 is a side view of a multi-axle vehicle having a skid control system which includes a failsafe system according to the present invention.

FIG. 2 is a schematic diagram in block diagram form of the skid control system including failsafe system of FIG. 1.

FIG. 3 is a detailed electrical schematic diagram of one form of failsafe circuit for the failsafe system.

FIG. 4 is an electrical schematic diagram of another embodiment of failsafe circuit.

DESCRIPTION OF THE PREFERRED EMBODIMENT

FIG. 1 discloses a tractor-trailer 10 having a skid control system which includes a failsafe system according to the present invention. Tractor-trailer 10 has a multi-axle trailer 12 with at least a pair of wheels on each axle. Operatively associated with each axle is a skid control module 14 which includes a skid control circuit for skid controlling the wheels of the axle and a failsafe circuit in accordance with the present invention. Although the disclosure illustrates the skid control applied to the axles of the trailer only, it will be understood and appreciated that the skid control system and associated failsafe system can be used generally in any vehicle as applied to any desired wheels thereof and is not to be limited to the disclosed usage in a trailer only. The skid control modules 14 are operatively coupled with other skid control system components such as brake modulators and wheel speed sensors so that the skid control circuit provides skid control of the wheels of each axle. These components of the system have been omitted from the description and drawing for sake of clarity and are well known in the art. Pursuant to the present invention skid control modules 14 are operatively coupled together via a wiring harness 16 which is schematically illustrated by a single line in FIG. 1 although actually comprising a plurality of various wires connecting specific individual circuits. A warning device 18 is located in the tractor and is operatively coupled via wiring harness 16 with skid control modules 14 to provide a warning signal to indicate the existence of a fault in the system. Such a warning device may be a buzzer, lamp, etc.

The skid control system including failsafe system are illustrated in block diagram form in FIG. 2. Modules 14 are identical, and each comprises a skid control circuit 20 which is of known construction and a failsafe circuit 22 in accordance with the present invention. Each module 14 comprises a plurality of connector terminals which mate with corresponding connector terminals of plugs of harness 16. Certain ones of these terminals (identified by the numeral 24) solely couple skid control circuit 20 with components such as wheel speed sensors, brake modulators, etc. to provide skid control for the wheels of the associated axle. As details of these do not directly pertain to the present invention, discussion thereof is omitted for sake of clarity in the present disclosure. However, each skid control circuit 20 operates from an electric power supply 25 (illustrated as a DC voltage source supplying a voltage of +V volts). Supply 25 is coupled with each module 14 via harness 16, harness 16 having a pair of terminals at each module which connect respectively with a pair of supply terminals 26, 28 on each module. As illustrated, terminal 26 is the positive supply terminal connected to the positive terminal of supply 25 and terminal 28 the negative supply terminal connected to the negative terminal of supply 25. Either terminal of the supply could be grounded so that the electrical system could be either a positive ground system or a negative ground system. Thus a potential difference of +V volts is supplied to each of the skid control modules 14 in order to supply power to skid control circuits 20.

Each failsafe circuit 22 comprises internally of its module 14 a pair of terminals 22a, 22b which connect internally of the module with terminals 26 and 28 respectively. Therefore, when power is supplied to the module it is supplied both to skid control circuit 20 and to failsafe circuit 22. Failsafe circuit 22 also comprises an input terminal 22c which connects to a connector terminal 30 on module 14 and an output terminal 22d which connects to a connector terminal 32 on module 14. Terminals 30 and 32 connect with mating terminals in harness 16. The failsafe circuits of the modules are connected by harness 16 in the following fashion. The positive terminal of supply 25 is coupled to terminal 30 of the first module 14. Terminal 32 of the first module is coupled to terminal 30 of the second module; terminal 32 of the second module to terminal 30 of the third module; and terminal 32 of the third module connects to warning device 18. As will be seen in greater detail from the description of FIGS. 3 and 4, this particular connection of failsafe circuits 22 results in the failsafe circuits being coupled with each other in cascade fashion forming a chain, and therefore the failsafe system forms a "daisy chain". Briefly, each failsafe circuit 22 provides an output signal at its output terminal 22d so long as both an input signal is present at its input terminal 22c and +U voltage is being properly supplied from power supply 25 to its module 14. The coupling of the positive terminal of power supply 25 to input terminal 22c of the first failsafe circuit 22 of the cascaded chain of circuits forms an input signal to this first circuit. So long as power is supplied in proper polarity to the terminals 22a, 22b of this first module from power supply 25, the failsafe circuit thereof provides an output signal at terminal 22d. This output signal becomes the input signal to the next failsafe circuit 22 in the chain. With power being supplied from power supply 25 to all the modules in the chain, the output signal of the immediately preceding failsafe circuit is supplied to the input of the immediately succeeding failsafe circuit and an output signal ultimately appears at the output terminal of the last failsafe circuit in the chain. Thus in effect, a signal at the input of the first failsafe circuit propagates along the chain to the output of the last failsafe circuit so long as power is being properly supplied to each of the individual modules. This mode of operation presupposes that the wiring harness 16 has been properly constructed and connected with the modules and that no faults in the wiring exist. The invention has the additional advantages, in addition so that of sensing loss of power at one of the modules, of providing a warning signal should the wiring be initially improperly constructed and connected or should a fault subsequently occur in the wiring such as a broken wire, loose connection, etc. Furthermore, each failsafe circuit possesses a self-checking characteristic whereby for substantially all possible types of internal failures it will not propagate the signal.

Warning device 18 provides a warning only when an output signal fails to appear at the output terminal of the last failsafe circuit. Therefore, if the last failsafe circuit in the chain fails to supply an output signal, warning device 18 gives a warning indicative of a fault somewhere in the system. Illustratively, the fault could be any of those mentioned above. Thus the failsafe system of the present invention has the capability of indicating any of a large number of various potential fault or failure conditions in the system. If desired, the warning device could also be used to disable the skid control system entirely. From the foregoing description, therefore, it will be recognized that the failsafe system in effect provides a chain through which an input signal applied to the first failsafe circuit of the chain can propagate. The signal will, in fact, propagate through the chain to prevent the warning device from giving a warning only if the wiring to the modules is correct, power is being supplied to all of the modules and no faults exist in the wiring and the failsafe circuits themselves. In the event of a failure in any of these, the chain is broken and no signal appears at the output of the last failsafe circuit in the chain; the warning device then provides a warning indicative of a fault or failure.

FIG. 3 discloses circuit details of the construction of a first embodiment of failsafe circuit 22. Each failsafe circuit 22 has connected between its input terminal 22c and its negative supply terminal 22b a resistor R1 connected in series with the parallel combination of a resistor R2 and a capacitor C1. These three elements form an input circuit to the base terminal of a transistor Q1 whose emitter terminal connects to terminal 22b. The collector terminal of transistor Q1 connects through a resistor R3 to the base of another transistor Q2. Transistor Q2 has its emitter terminal connected to terminal 22a, and a resistor R4 connects between the base and emitter of transistor Q2. A resistor R5 and a resistor R6 connect in series with each other between the collector of transistor Q2 and the anode of a diode D1. The junction of resistors R5 and R6 connects to output terminals 22d. The cathode of diode D1 connects to the junction of resistor R3 and the collector of transistor Q1. The junction of diode D1 and resistor R6 connects through a resistor R7 to the base terminal of a transistor Q3 which connects in Darlington fashion with a transistor Q4. The collector terminals of transistors Q3 and Q4 connects through a diode D2 to terminal 22d. The emitter terminal of transistor Q4 connects through a resistor R8 to terminal 22b. A capacitor C2 connects between terminals 22d and 22b.

Failsafe 22 further includes a protection circuit to protect against excessive current drawn by terminals 22d and 22b; for example, this might occur if wiring is improperly connected or, as will be better understood later, if the bulb is missing. This protection circuit includes a transistor Q5 whose emitter terminal connects to terminal 22b, whose collector terminal connects to the junction of diode D1 and resistor R3, and whose base terminal connects through a resistor R9 to the junction of transistor Q4 and resistor R8. A resistor R10 also connects from the base terminal of transistor Q5 to the junction between diode D2 and transistors Q3 and Q4. A zener diode Z1 for transient protection connects from the cathode of diode D2 to the base of transistor Q3. It will be appreciated that the failsafe circuit 22 requires power from the power supply in order to be operational and therefore, the signals appearing at the terminals 22c, 22d are referenced to the potentials of the power supply by virtue of the disclosed circuit construction.

Failsafe circuit 22 operates in the following fashion. With the power connections properly made to its module at terminals 26 and 28 the voltage from power supply 25 is supplied to terminals 22a and 22b with terminal 22a the positive terminal and 22b the negative terminal. For the first failsafe circuit in the chain the positive terminal of power supply 25 is supplied to terminal 22c via terminal 30. The base circuit of transistor Q1, by virtue of the connection of power supply 25 to terminal 22c, renders transistor Q1 conductive. With transistor Q1 conducting, the collector voltage thereof becomes less positive and this less positive voltage is applied to the base circuit of transistor Q2 to cause this latter transistor to become conducting. With transistor Q2 conducting, current flows through the emitter-collector circuit thereof, through resistors R5, R6, diode D1 and through the collector-emitter circuit of transistor Q1. As a consequence, a fraction of the power supply voltage is developed as a positive voltage at terminal 22d. This voltage is equal to the power supply voltage multiplied by the voltage dividing action of resistors R5 and R6 less the voltage drops through transistors Q1, Q2 and diode D1. This positive voltage at terminal 22d is supplied to the input 22c of the next succeeding failsafe circuit in the chain and this succeeding failsafe circuit operates in like manner provided that the connections thereto are proper. From this mode of operation it can be understood that so long as all the connections to the individual modules are proper and power supply 25 is supplying power to all the modules a positive voltage appears at the output 22d of the last failsafe circuit in the chain and this, as mentioned earlier, prevents warning device 18 from giving a warning.

When the potential of power supply 25 fails to be supplied to one or more of the modules, or when a wiring fault or failure occurs, or when one of the failsafe circuits itself fails, the positive voltage signal fails to appear at terminal 22d of the last module, and in this instance warning device 18 gives a warning. Thus, if power supply 25 itself fails, none of the modules 14 is receiving power, and the failsafe circuits cannot possibly develop a positive voltage signal at the output of the last failsafe circuit; hence, a warning is given. If there is a failure in any one or more of the conductors of harness 16 via which power supply 25 is coupled to the modules, at least one of the failsafe circuits will break the chain and a warning will be given. Furthermore, if the path along the chain fails because of faulty connection between the output and input of successive failsafe circuits or to the input of the first circuit in the chain, failure of any one of the input terminals 22c to receive a positive voltage input signal will prevent transistor Q1 thereof from conducting. With transistor Q1 not conducting, Q2 cannot conduct. Since transistor Q2 cannot conduct, there is no Q2 collector current; hence, no positive voltage is developed at the output terminal 22d and the warning will be given. Accordingly, it will be noted that with the present invention failure at any one of the three terminals 22a, 22b and 22c of each failsafe circuit will cause warning device 18 to give a warning. Therefore, the invention has the advantage of providing indication of any one of a number of possible fault conditions thereby promoting safety and minimizing the chance of an inoperative skid control system occurring. One especially important advantage of the invention is that the failsafe system can provide a warning indicating the loss of ground at any point in the system.

Transistors Q3 and Q4 and associated circuit elements are used with a specific form of warning device 18 wherein the warning device is an indicator lamp adapted to be energized from power supply 25. These connections are shown in phantom in FIG. 3. One terminal of lamp 18 connects to terminal 22d of circuit 22 and the other terminal of lamp 18 connects to the positive terminal of power supply 25. The negative terminal of power supply 25 is coupled with ground in a negative ground system. Where a chain of failsafe circuits are employed it would be necessary to provide transistors Q3 and Q4 and associated circuit elements only in the last failsafe circuit in the chain which drives warning device 18; alternatively, however, it may be desirable to provide these circuit components in all failsafe circuits so that any one of the failsafe circuits could potentially be used to drive warning device 18. The operation of the circuit for driving lamp is as follows. So long as an output signal is present at the output terminal 22d of the last failsafe circuit in the chain there is insufficient voltage across lamp 18 to light the lamp. Transistors Q3 and Q4 are not conducting at this time. In the event of failure somewhere in the chain, transistor Q1 is off, thereby unclamping transistor Q3. Transistors Q3 and Q4 begin conducting. Once transistors Q3 and Q4 begin to conduct, an increasing amount of current is drawn through lamp 18 to cause the lamp to light, thereby giving a signal indicating a fault or failure condition.

In the event that positive terminal of power supply 25 were accidentally connected to terminal 22d, failsafe circuit 22 provides protection as follows. Transistor Q5 is biased for conduction to shunt base current away from transistor Q3 for excessive current sensed by resistor R8 and/or excessivve voltage sensed by resistor R10 and diode D2.

FIG. 4 discloses another embodiment of failsafe circuit 22 which is like the embodiment of FIG. 3 insofar as overall operation is concerned. Like elements from the embodiment of FIG. 3 are identified by like numerals in FIG. 4 and need not be described in detail. The main difference between the embodiments of FIGS. 3 and 4 is that in FIG. 4 three diodes D3, D4 and D5 connect between the base of transistor Q3 and terminal 22b to limit the voltage which can appear at the base of transistor Q3 to the sum of the individual drops across the three diodes.

It is to be understood that the foregoing description is that of a preferred embodiment of the invention. Various changes and modifications may be made without departing from the spirit and scope of the invention as defined by the appended claims.

What is claimed is:

1. A failsafe circuit means comprising an input terminal, an output terminal, and a pair of supply terminals for respectively receiving from a single source a supply potential and a ground potential, means forming an input circuit operatively coupled with said input terminal and one of said pair of supply terminals, means forming an output circuit operatively coupled with said output terminal and the other of said pair of supply terminals, said input circuit comprising first normally conductive electronic switch means that is rendered non-conductive in response to the absence of either an input signal normally applied to said input terminal or the respective potential normally present at said one supply terminal, said output circuit means comprising a second normally conductive electronic switch means and a voltage dividing means, means operatively coupling said input circuit and said output circuit such that said second electronic switch means is rendered nonconductive whenever either said first electronic switch means is rendered nonconductive or in response to the absence of the respective potential normally present at said other supply terminal, said voltage dividing means being operatively coupled with said output terminal for supplying at said output terminal an output signal which is a fraction of said supply potential whenever both of said electronic switch means are conducting.

2. A failsafe circuit means according to claim 1 wherein said voltage dividing means comprises a pair of resistors connected in series with the connection of said pair of resistors being operatively coupled to said output terminal.

3. A failsafe circuit means according to claim 1 wherein said voltage divider is connected in series with said second switch means.

4. A failsafe circuit means according to claim 1 wherein said first switch means has a control terminal and two output terminals with said control terminal operatively coupled with said input terminal and with at least one of said output terminals operatively coupled with said second switch means so that when said first switch means is actuated in response to said input signal said first switch means actuates said second switch means.

5. A failsafe circuit means according to claim 4 wherein said second switch means has a control terminal and two output terminals with said control terminal being operatively coupled with said one output terminal of said first switch means to provide a signal from said one output terminal of said first switch means to said control terminal of said second switch means to actuate said second switch means upon actuation of said first switch means and with one of said output terminals of said second switch means being operatively coupled with said voltage dividing mens for substantially full application of said supply potential across said voltage dividing means upon actuation of said second switch means.

6. A failsafe circuit means according to claim 5 wherein the other of said output terminals of said first switch means is operatively coupled to said one supply terminal and the other of said output terminals of said second switch means is operatively coupled to said other supply terminal.

* * * * *